(12) United States Patent
Ito et al.

(10) Patent No.: US 10,164,154 B2
(45) Date of Patent: Dec. 25, 2018

(54) SEMICONDUCTOR LIGHT EMITTING DEVICE

(71) Applicant: ROHM CO., LTD., Kyoto (JP)

(72) Inventors: Yohei Ito, Kyoto (JP); Yoichi Mugino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/666,044

(22) Filed: Aug. 1, 2017

(65) Prior Publication Data
US 2018/0062042 A1    Mar. 1, 2018

(30) Foreign Application Priority Data

Aug. 26, 2016 (JP) .................. 2016-165939

(51) Int. Cl.
| | |
|---|---|
| *H01L 33/40* | (2010.01) |
| *H01L 33/00* | (2010.01) |
| *H01L 33/04* | (2010.01) |
| *H01L 33/08* | (2010.01) |
| *H01L 33/24* | (2010.01) |
| *H01L 33/60* | (2010.01) |
| *H01L 33/42* | (2010.01) |

(Continued)

(52) U.S. Cl.
CPC ........ *H01L 33/405* (2013.01); *H01L 33/0025* (2013.01); *H01L 33/0079* (2013.01); *H01L 33/04* (2013.01); *H01L 33/08* (2013.01); *H01L 33/24* (2013.01); *H01L 33/42* (2013.01); *H01L 33/44* (2013.01); *H01L 33/60* (2013.01); *H01L 33/38* (2013.01); *H01L 33/46* (2013.01); *H01L 2924/0002* (2013.01)

(58) Field of Classification Search
CPC ... H01L 33/405; H01L 33/0079; H01L 33/60; H01L 33/24; H01L 33/025; H01L 33/04; H01L 33/08; H01L 33/46
See application file for complete search history.

(56) References Cited

U.S. PATENT DOCUMENTS

| | | | |
|---|---|---|---|
| 2012/0043566 A1* | 2/2012 | Wu ........................ | H01L 33/405 257/94 |
| 2012/0146072 A1* | 6/2012 | Yamasaki ............... | H01L 33/16 257/98 |

(Continued)

FOREIGN PATENT DOCUMENTS

JP    2007221029 A    8/2007

*Primary Examiner* — A. Sefer
(74) *Attorney, Agent, or Firm* — Hamre, Schumann, Mueller & Larson, P.C.

(57) ABSTRACT

The present invention provides a semiconductor light emitting device with a simple structure and capable of improving light extraction efficiency. The semiconductor light emitting device 1 includes a substrate 2, a metal layer 3 on the substrate 2, a light-transmitting conductive layer 4 on the metal layer 3, an insulation layer 30 on the light-transmitting conductive layer 4, and a III-V semiconductor structure 5 on the insulation layer 30. The III-V semiconductor structure 5 includes a light emitting layer 8, a p-type semiconductor layer 9, and an n-type semiconductor layer 10. A refractive index n1 of a p-type GaP contact layer 11 of the p-type semiconductor layer 9, a refractive index n2 of the insulation layer 30, and a refractive index n3 of the light-transmitting conductive layer 4 satisfy the relation: $n1 > n2 < n3$.

20 Claims, 14 Drawing Sheets

(51) Int. Cl.
    *H01L 33/44*     (2010.01)
    *H01L 33/46*     (2010.01)
    *H01L 33/38*     (2010.01)

(56) References Cited

U.S. PATENT DOCUMENTS

| | | | |
|---|---|---|---|
| 2012/0273793 A1* | 11/2012 | Nishikawa | H01L 33/14 257/76 |
| 2013/0075771 A1* | 3/2013 | Fujimoto | H01L 33/30 257/96 |
| 2013/0221367 A1* | 8/2013 | Furuki | H01L 33/22 257/76 |
| 2014/0077221 A1* | 3/2014 | Genei | H01L 33/14 257/76 |
| 2015/0137170 A1* | 5/2015 | Ito | H01L 33/0095 257/99 |
| 2015/0249180 A1* | 9/2015 | Akaike | H01L 33/0079 438/29 |

* cited by examiner

SEMICONDUCTOR LIGHT EMITTING DEVICE

BACKGROUND

This invention relates to a semiconductor light emitting device.

The light emitting diode of Patent Literature 1 comprises a semiconductor layer in which an ohmic contact layer, a second metal layer, a first metal layer, an insulation layer, a p-type contact layer, a p-type clad layer, an MQW (Multiple Quantum Well) active layer, an n-type clad layer, and an n-type contact layer are laminated in the order listed on one surface of a support substrate. The light emitting diode of Patent Literature 1 also has an ODR structure. That is, a contact portion is buried in a part of the insulation layer between the p-type contact layer and the first metal layer, whereby the first metal layer and the p-type contact layer are electrically connected. A p-side electrode is provided on the backside of the support substrate, and a ring-shaped n-side electrode is provided on the n-type contact layer.

PRIOR TECHNICAL LITERATURE

[Patent Literature 1] JP2007221029A

BRIEF SUMMARY OF THE INVENTION

Problems to be Solved in the Present Invention

An object of the present invention is to provide a semiconductor light emitting device with a simple configuration that can improve light extraction efficiency as compared with prior arts.

Technical Means for Solving Problems

A semiconductor light emitting device according to one embodiment of the present invention comprises a substrate, a metal layer on the substrate, a light-transmitting conductive layer on the metal layer, an insulation layer on the light-transmitting conductive layer, and a semiconductor layer above the insulation layer. The semiconductor layer comprises a light emitting layer, a first conductive type layer disposed on the substrate side with respect to the light emitting layer, and a second conductive type layer disposed on the opposite side of the substrate with respect to the light emitting layer. A refractive index $n1$ of the first conductive type layer, a refractive index $n2$ of the insulation layer, and a refractive index $n3$ of the light-transmitting conductive layer satisfy the relation: $n1>n2<n3$.

According to this configuration, since the relationship between the refractive index $n2$ of the insulation layer and the refractive index $n3$ of the light-transmitting layer is $n2<n3$, the reflection of light at the insulation layer/light-emitting layer interface (first interface) can be suppressed. The light incident on the light-transmitting conductive layer without being reflected by the first conductive type layer/insulation layer interface (second interface) can reach the metal layer and can be efficiently reflected by the metal layer. As a result, light extraction efficiency can be improved.

Since the refractive indices of the first conductive type layer, the insulation layer and the light-transmitting conductive layer can be appropriately designed, the structure is simple.

In a semiconductor light emitting device according to one embodiment of the present invention, a total thickness T comprising a sum of optical film thicknesses of the light-transmitting conductive layer and the insulation layer can be an odd multiple of $\lambda/4$ (where $\lambda$ is an emission wavelength).

According to this configuration, since the total thickness T comprising the optical film thicknesses of the insulation layer and the light-transmitting conductive layer is an odd multiple of $\lambda/4$ (where $\lambda$ is the emission wavelength), the reflectance in the insulation layer/light-transmitting layer interface (first interface) can be effectively reduced. Thus, since the amount of light passing through the first interface can be increased, the amount of light reflected by the metal layer can be increased. Furthermore, since the total thickness T comprising the optical film thicknesses of the insulation layer and the light-transmitting conductive layer can be appropriately designed, the structure is simple.

In a semiconductor light emitting device according to one embodiment of the present invention, a critical angle of total reflection at the interface between the first conductive type layer and the insulation layer can be 30° or less.

According to this configuration, since totally reflected light in the first conductive type layer/insulation layer interface (second interface) can be increased, the light extraction efficiency can be further improved.

In a semiconductor light emitting device according to one embodiment of the present invention, a difference between the refractive index $n1$ and the refractive index $n2$ may be 1.7 or more.

According to this configuration, a critical angle of total reflection in the first conductive type layer/insulation layer interface (second interface) can be reduced, thereby increasing totally reflected light in the second interface and further improving the light extraction efficiency.

In a semiconductor light emitting device according to one embodiment of the present invention, the refractive index $n1$ can be 3.0 to 3.5, the refractive index $n2$ can be 1.3 to 1.6, and the refractive index $n3$ can be 1.7 to 2.0.

In a semiconductor light emitting device according to one embodiment of the present invention, the first conductive type layer can include p-type GaP, the insulation layer can include SiO2, and the light-transmitting conductive layer can include ITO (indium tin oxide).

In a semiconductor light emitting device according to one embodiment of the present invention, the emission wavelength $\lambda$ can be 560 nm to 660 nm and the total thickness T comprising the sum of the optical film thickness can be 1.25$\lambda$.

According to this configuration, the reflectance in the insulation layer/light-transmitting conductive layer interface (first interface) can be reduced to less than 50%. In a semiconductor light emitting device according to one embodiment of the present invention, the insulation layer includes a contact hole for selectively exposing the first conductive type layer. In the contact hole, a contact metal electrically connected to the first conductive type layer is disposed. An edge of the light-transmitting conductive layer can be arranged to be recessed toward the region on the insulation layer more than the periphery of the contact hole.

According to this configuration, step coverage at the edge part of the insulation layer and the light-transmitting conductive layer can be improved. Therefore, the metal layer and the contact metal can be connected in a state where the edge part is satisfactorily covered with a part of the metal layer. As a result, disconnection failure between the metal layer and the contact metal can be reduced. As a result, the contact resistance between the contact metal and the metal layer can be reduced, and an increase in a forward voltage can be suppressed.

In a semiconductor light emitting device according to one embodiment of the present invention, a space is formed between the periphery of the contact hole and the edge of the contact metal, and the space can be filled with the metal layer.

In a semiconductor light emitting device according to one embodiment of the present invention, the metal layer can contain Au.

In a semiconductor light emitting device according to one embodiment of the present invention, the substrate can include a silicon substrate.

A semiconductor light emitting device according to one embodiment of the present invention can include a surface electrode on the semiconductor layer.

A semiconductor light emitting device according to one embodiment of the present invention can include a back electrode on the backside of the substrate.

In a semiconductor light emitting device according to one embodiment of the present invention, a surface of the semiconductor layer can be formed to be a fine uneven shape.

DETAILED DESCRIPTION

Figure 1:
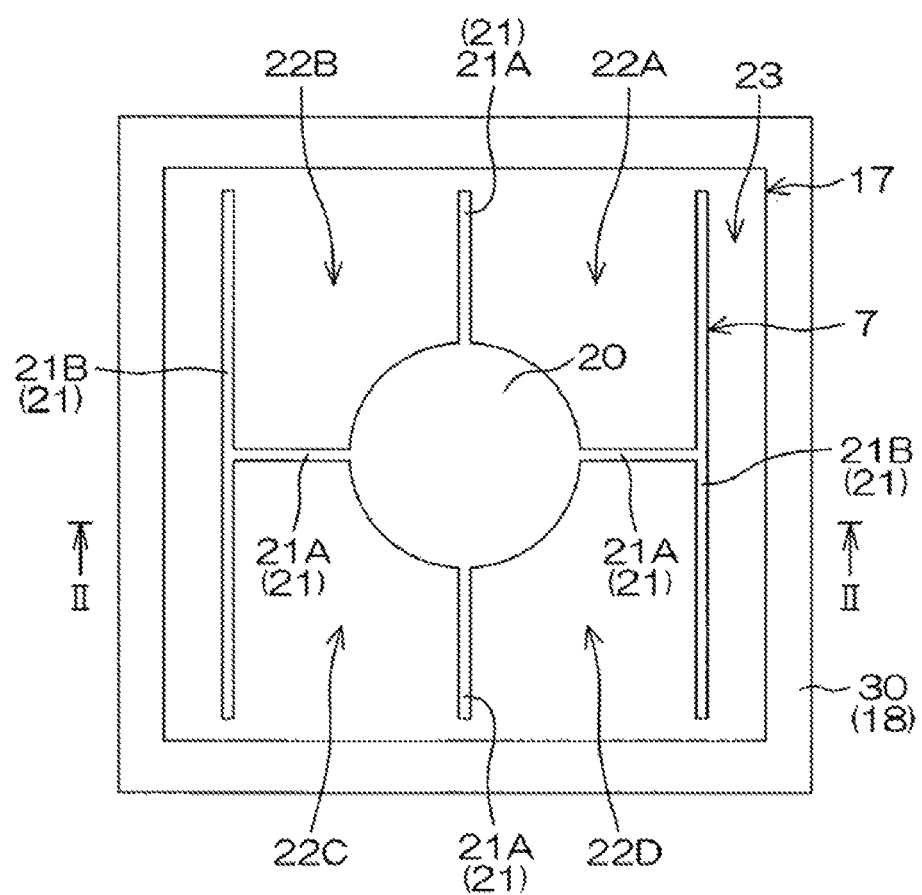
FIG. 1 is a top view showing a semiconductor light emitting device according to one embodiment of the present invention.
Figure 2:
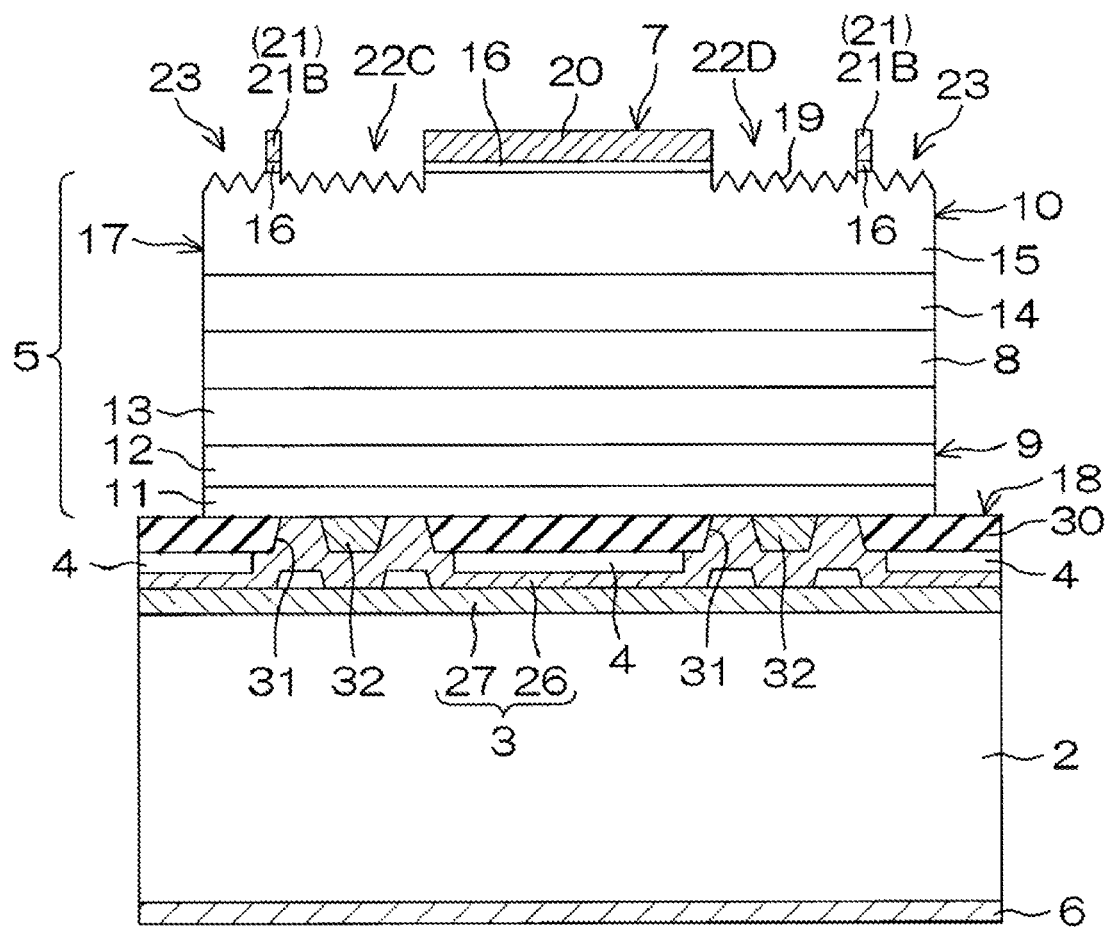
FIG. 2 is a cross-sectional view taken along line II-II of FIG. 1.

Embodiments of the present invention will be described in detail below with reference to the accompanying drawings. FIG. 1 is a top view showing a semiconductor light emitting device 1 according to one embodiment of the present invention. FIG. 2 is a cross-sectional view taken along line II-II of FIG. 1. The semiconductor light emitting device 1 includes a substrate 2, a metal layer 3 on the substrate 2, a light-transmitting conductive layer 4 on the metal layer 3, an insulation layer 30 on the light-transmitting conductive layer 4, a III-V semiconductor structure 5 (as an example of a semiconductor layer of the present invention) on the insulation layer 30, a p-side electrode 6 (back electrode) formed to be in contact with a back surface (a surface opposite to the III-V semiconductor structure 5) of the substrate 2, and an n-side electrode 7 (surface electrode) formed to contact a surface of the III-V semiconductor structure 5.

The substrate 2 in this embodiment is composed of a silicon substrate. Of course, the substrate 2 can be composed of a semiconductor substrate such as GaAs (gallium arsenide), GaP (gallium phosphide), or the like, for example. In this embodiment, the substrate 2 is formed in a substantially square shape in a top view as shown in FIG. 1, but the planar shape of the substrate 2 is not particularly limited and can be rectangular, for example. The thickness of the substrate 2 can be, for example, about 150 μm.

In this embodiment, the metal layer 3 is made of Au or alloy containing Au. The metal layer 3 can be a single layer of Au or Au alloy, or can be a layer in which a plurality of Au layers, Au alloy layers or other metal layers are laminated. When the metal layer 3 includes a plurality of laminated layers, it is preferable that at least the surface that contacts the light-transmitting conductive layer 4 is made of an Au layer or an Au alloy layer (for example, AuBeNi or the like). In one example, the laminated structure includes layers of Au and Ti, wherein the Au layer faces the light-transmitting conductive layer 4 and the Ti layer faces the substrate 2. In the metal layer 3, it is not necessary for distinct boundaries to be formed between the plurality of metal materials of the metal layer 3. The plurality of metal materials can be distributed in sequence from the substrate 2 side, for example. In this embodiment, the metal layer 3 is formed by bonding a growth substrate 24 (described later) to the substrate 2 and joining a first metal layer 26 (described later) and a second metal layer 27 (described later). In FIG. 2, for convenience, a boundary (bonding surface) between the first metal layer 26 and the second metal layer 27 is shown, but this boundary may not be clearly visible.

The metal layer 3 is formed to cover the entire surface of the substrate 2. The (total) thickness of the metal layer 3 can be, for example, between approximately 5000 Å and 7000 Å. The III-V semiconductor structure 5 includes a light emitting layer 8, a p-type semiconductor layer 9 as an example of a first conductive type layer of the present invention, and an n-type semiconductor layer 10 as an example of a second conductive type layer of the present invention. The p-type semiconductor layer 9 is disposed on the substrate 2 side with respect to the light emitting layer 8, and the n-type semiconductor layer 10 is disposed on the n-side electrode 7 side with respect to the light emitting layer 8. Thus, the light emitting layer 8 is sandwiched between the p-type semiconductor layer 9 and the n-type semiconductor layer 10, and a double heterojunction is formed. In the light emitting layer 8, electrons are injected from the n-type semiconductor layer 10 and holes are injected from the p-type semiconductor layer 9. By recombining these electrons and holes in the light emitting layer 8, light is generated.

The p-type semiconductor layer 9 is formed by laminating a p-type GaP contact layer 11 (for example, 0.3 μm thick), a p-type GaP window layer 12 (for example, 1.0 μm thick) and a p-type AlInP clad layer 13 (for example, 8 μm thick) in order from the substrate 2 side. The n-type semiconductor layer 10 is formed by laminating an n-type AlInP clad layer 14 (for example, 0.8 μm thick), an n-type AlInGaP window layer 15 (for example, 1.8 μm thick), and an n-type GaAs contact layer 16 (for example, 0.3 μm thick) in order on the light emitting layer 8.

The p-type GaP contact layer 11 and the n-type GaAs contact layer 16 are low resistance layers for ohmic contact with the p-side contact metal 32 and the n-side electrode 7, respectively. The p-type GaP contact layer 11 is made to be a p-type semiconductor by doping GaP with, for example C (carbon), as a p-type dopant at a high concentration. The n-type GaAs contact layer 16 is made to be an n-type semiconductor layer by doping GaAs with, for example Si, as an n-type dopant at a high concentration.

The p-type GaP window layer 12 is made to be a p-type semiconductor by doping GaP with, for example, Mg as a p-type dopant. The n-type AlInGaP window layer 15 is made to be an n-type semiconductor layer by doping AlInGaP with, for example, Si as an n-type dopant. The p-type AlInP clad layer 13 is made to be a p-type semiconductor by doping AlInP with, for example, Mg as a p-type dopant. The n-type AlInP clad layer 14 is made to be an n-type semiconductor layer by doping AlInP with Si as an n-type dopant.

The light emitting layer 8 has, for example, an MQW (multiple-quantum well) structure including InGaP. Light is generated by recombination of electrons and holes, and the MQW structure is a layer for amplifying the generated light. In this embodiment, the light emitting layer 8 has a multiple quantum well (MQW) structure formed by alternately laminating (for a plurality of periods) a quantum well layer (for example, 5 nm thick) made of AlX1InGaP and a barrier layer (for example, 5 nm thick) made of AlX2InGaP (X1<X2). In this case, in the quantum well layer made of AlX1InGaP, the band gap is relatively small by setting the composition ratio of In to 5% or more, and the barrier layer made of AlX2InGaP has a relatively large band gap. For example, the quantum well layer (AlX1InGaP) and the barrier layer (AlX2InGaP) are alternately laminated for 2 to 50 periods, forming a light emitting layer 8 of a multiple quantum well structure. An emission wavelength corresponds to a band gap of the quantum well layer, and adjustment of the band gap can be performed by adjusting the composition ratio of In or Al. As the composition ratio of In increases, or as the composition ratio of Al decreases, the band gap becomes smaller and the emission wavelength becomes longer. In this embodiment, the emission wavelength is set to between 560 nm and 660 nm (for example, 625 nm) by adjusting the composition of In and Al in the quantum well layer (AlX1InGaP layer).

As shown in FIG. 1 and FIG. 2, a part of the semiconductor light emitting device 1 is removed to form a mesa part 17. Specifically, the n-type semiconductor layer 10, the light emitting layer 8 and the p-type semiconductor layer 9 are etched away from the surface of the III-V semiconductor structure 5 over the entire circumference of the III-V semiconductor structure 5. A mesa part 17 having a substantially rectangular shape in cross section is formed. The shape of the mesa part 17 is not limited to a substantially rectangular shape in cross section but can be trapezoidal, for example. The insulation layer 30 forms a drawer part 18 drawn out in a horizontal direction from the mesa part 17. As shown in FIG. 1, the mesa part 17 is surrounded by the drawer part 18 in top view.

On a surface of the mesa part 17, a fine uneven shape 19 is formed. By this fine uneven shape 19, light extracted from the III-V semiconductor structure 5 can be diffused. In this embodiment, as will be described later, the n-type GaAs contact layer 16 is selectively removed according to the shape of the n-side electrode 7, whereby the n-type AlInGaP window layer 15 is exposed, and the fine uneven shape 19 is formed on the exposed surface. In FIG. 1, the fine uneven shape 19 is omitted for clarity.

In this embodiment, the p-side electrode 6 as a back electrode is made of Au or alloy containing Au. Specifically, the p-side electrode 6 can be a laminated structure represented by Ti/Au, wherein the Ti side faces the substrate 2. The p-side electrode 6 is formed to cover the entire back surface of the substrate 2.

In this embodiment, the n-side electrode 7 as a surface electrode is made of Au or alloy containing Au. Specifically, the n-side electrode 7 can be a laminated structure represented by AuGeNi/Au, wherein the AuGeNi side faces the III-V semiconductor structure 5.

The n-side electrode 7 integrally includes a pad electrode part 20 and a branch electrode part 21 selectively branching from the pad electrode part 20 so as to define a certain region around the pad electrode part 20. In this embodiment, the pad electrode part 20 is disposed substantially at the center of the mesa part 17 as viewed from above. The branch electrode part 21 is formed so as to partition the enclosed areas 22A, 22B, 22C, 22D between the pad electrode part 20 and each of four corners of the mesa part 17. Each of the enclosed areas 22A to 22D is surrounded by: a branch electrode part 21A extending in a cross shape from the pad electrode part 20 toward each periphery of the mesa part 17, a branch electrode part 21B extending along each periphery of the mesa part 17 and crossing the cross-shaped branch electrode part 21A, and the pad electrode part 20. An area outside the branch electrode part 21B excluding the enclosed areas 22A to 22D is an outer peripheral area 23 of the mesa part 17.

Figure 3A:
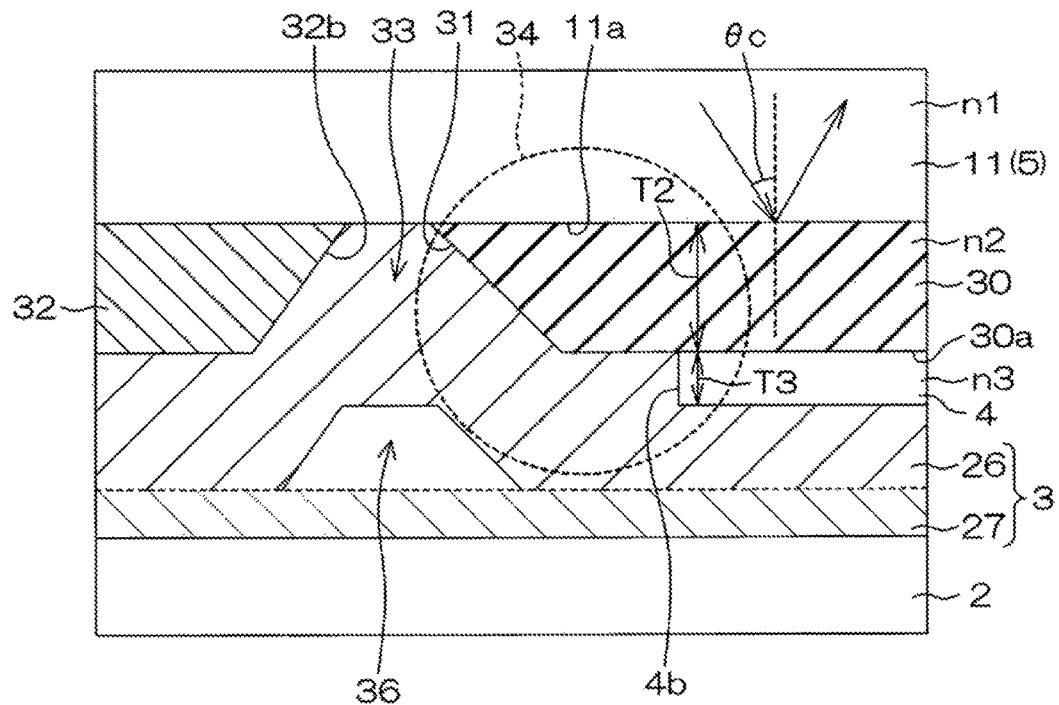
FIG. 3A and FIG. 3B are enlarged views of parts of the semiconductor light emitting device of FIG. 2.
Figure 3B:
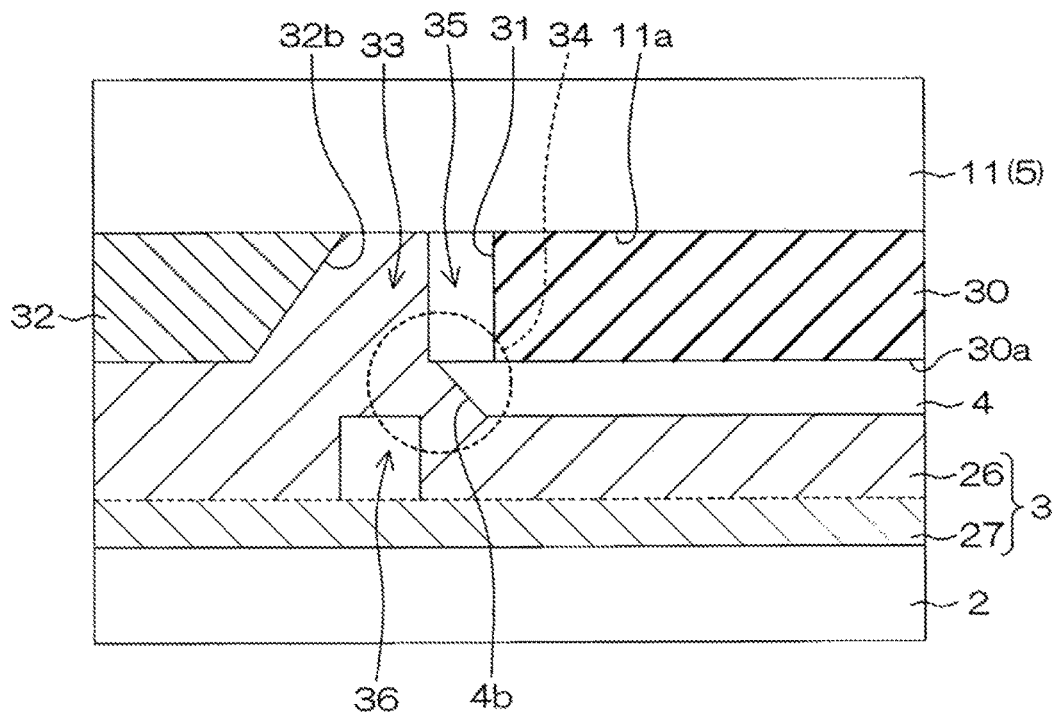

In this embodiment, since the n-type GaAs contact layer 16 has the same shape as the n-side electrode 7, the n-type AlInGaP window layer 15 is exposed in the enclosed areas 22A to 22D and the outer peripheral area 23. FIGS. 3A and 3B are enlarged views of parts of the semiconductor light emitting device 1 of FIG. 2. Features of the semiconductor light emitting device 1 will be described with reference to FIGS. 3A and 3B.

The lamination form of the III-V semiconductor structure 5, the insulation layer 30, the light-transmitting conductive layer 4, and the metal layer 3 is as follows. First, the insulation layer 30 is formed on a back surface 11a of the p-type GaP contact layer 11. In the insulation layer 30, a contact hole 31 for selectively exposing the p-type GaP contact layer 11 is formed. As shown in FIG. 3A, the contact hole 31 can be formed in a tapered shape in which the diameter of the contact hole 31 decreases toward the p-type GaP contact layer 11. Alternatively, as shown in FIG. 3B, the diameter of the contact hole 31 can be formed to be constant over the entire thickness direction.

In the contact hole 31, a p-side contact metal 32 is arranged so as to be in contact with the back surface 11a of the p-type GaP contact layer 11. The p-side contact metal 32 is made of, for example, Au or alloy containing Au. The p-side contact metal 32 can have the same thickness as the insulation layer 30 as shown in FIGS. 3A and 3B. The p-side contact metal 32 is formed smaller than an opening size of the contact hole 31, and a space 33 is formed between a periphery of the contact hole 31 and an edge 32b of the p-side contact metal 32.

The light-transmitting conductive layer 4 is formed on a back surface 30a of the insulation layer 30. The light-transmitting conductive layer 4 can be formed smaller than the insulation layer 30 as shown in FIG. 3A, or can be formed larger than the insulation layer 30 as shown in FIG. 3B. The structure of FIG. 3A is preferable. Specifically, as shown in FIG. 3A, it is preferable to form the light-transmitting conductive layer 4 so that an edge 4b thereof is recessed toward a region of a back surface 30a of the insulation layer 30 more than the periphery of the contact hole 31. Thus the light-transmitting conductive layer 4 is smaller than the insulation layer 30.

As a result, as shown in FIG. 3A, step coverage in an edge part 34 (for example, the part surrounded by the broken line in FIG. 3A) of the insulation layer 30 and the light-transmitting conductive layer 4 can be improved. Therefore, the metal layer 3 and the p-side contact metal 32 can be connected in a state where the space 33 is filled with the metal layer 3 and the edge part 34 is satisfactorily covered with a part of the metal layer 3. As a result, disconnection failure between the metal layer 3 and the p-side contact metal 32 can be reduced. Correspondingly, the contact resistance between the p-side contact metal 32 and the metal layer 3 can be reduced and an increase in a forward voltage can be suppressed.

As shown in FIG. 3B, when the edge 4b of the light-transmitting conductive layer 4 protrudes into the contact hole 31, the step coverage of the insulation layer 30 and the edge part 34 of the light-transmitting conductive layer 4 is not high. Therefore, after forming the metal layer 3, a cavity 35 in which the metal layer 3 does not exist is formed in the vicinity of the edge part 34 (for example, in the space 33). In some cases, the p-side contact metal 32 and the metal layer 3 may be separated by the cavity 35.

The metal layer 3 is formed to cover the light-transmitting conductive layer 4 and the p-side contact metal 32, and is electrically connected to the p-side contact metal 32. The metal layer 3 includes a cavity 36 in a portion opposite to the space 33 between the periphery of the contact hole 31 and the edge 32b of the p-side contact metal 32. Next, refractive indices of the III-V semiconductor structure 5, the insulation layer 30 and the light-transmitting conductive layer 4 are explained. In the semiconductor light emitting device 1, a refractive index n1 of the p-type GaP contact layer 11, a refractive index n2 of the insulation layer 30, and a refractive index n3 of the light-transmitting conductive layer 4 satisfy the relation: n1>n2<n3.

For example, the refractive index n1 can be between 3.0 and 3.5, the refractive index n2 can be between 1.3 and 1.6, and the refractive index n3 can be between 1.7 and 2.0. These ranges are merely examples. With respect to the refractive index n1 and the refractive index n2, it is preferable to set a difference (n1−n2) between the indexes such that a critical angle of total reflection θc at the interface between the p-type GaP contact layer 11 and the insulation layer 30 is 30° or less (preferably 27° or less). For example, it is preferable that the difference between the refractive index n1 and the refractive index n2 is 1.7 or more.

By defining the refractive index n1 and the refractive index n2 in this manner, totally reflected light at the interface of p-type GaP contact layer 11 and insulation layer 30 can be increased, so that the light extraction efficiency can be improved. For example, if a p-type GaP contact layer 11 (n1=3.32) is combined with an insulation layer 30 (n2=1.46) made of SiO2, the critical angle θc can be approximately 26°. Alternatively, when a p-type GaP contact layer 11 (n1=3.32) is combined with an insulation layer 30 (n2=2.10) made of SiN, the critical angle θc is approximately 37°. Comparing these two cases, the insulation layer 30 made of SiO2 can increase the luminous intensity by about 18% as compared with the insulation layer 30 made of SiN.

As a preferable material of the insulation layer 30 combined with the p-type GaP contact layer 11, as an alternative to SiO2, for example, MgF2 (n2=1.38) or the like can be used. Further, ITO (n3=1.81), ZnO (n3=2.0), IZO (n3=2.1), and the like can be used as the material of the light-transmitting conductive layer 4.

For light passing through the p-type GaP contact layer 11/insulation layer 30 interface, it is more efficient to reflect the light with the metal layer 3 than to reflect the light at the insulation layer 30/light-transmitting conductive layer 4 interface. Therefore, in this embodiment, in order to reduce the reflectance at the insulation layer 30/light-transmitting layer 4 interface, the following conditions are provided.

In this embodiment, a total thickness T comprising a sum of optical film thicknesses of the insulation layer 30 and the light-transmitting conductive layer 4 is an odd multiple of λ/4 (where λ is an emission wavelength). Each optical film thickness T can be obtained by the equation T=physical film thickness (nm)×refractive index. In this embodiment, T=(thickness T2 of insulation layer 30)×(refractive index n2)+(thickness T3 of light-transmitting conductive layer 4)×(refractive index n3). Specifically, when the emission wavelength λ of the semiconductor light emitting device 1 is 560 nm to 660 nm, the total thickness T comprising the sum of optical film thicknesses is preferably 1.25λ. Table 1 shows examples of preferable total thickness T (1.25λ) of optical film thicknesses when the emission wavelength λ is 590 nm, 605 nm, 618 nm, and 625 nm.

TABLE 1

| emission wavelength λ | insulation layer 30(SiO2) | | light-transmitting conductive layer 4(ITO) | | total thickness T of optical film thicknesses |
|---|---|---|---|---|---|
| | thickness T2[nm] | refractive index n2 | thickness T3[nm] | refractive index n3 | |
| 590 nm | 100.5 | 1.464 | 319.0 | 1.851 | 737.5 |
| 605 nm | 314.0 | 1.465 | 162.0 | 1.829 | 756.3 |
| 618 nm | 310.0 | 1.465 | 174.0 | 1.832 | 772.5 |
| 625 nm | 321.1 | 1.460 | 172.0 | 1.820 | 781.3 |

As described above, by having refractive index n2<refractive index n3, reflection of light at the insulation layer 30/light-transmitting conductive layer 4 interface can be suppressed. Also, the total thickness T comprising the sum of optical film thicknesses of the insulation layer 30 and the light-transmitting conductive layer 4 is an odd multiple of λ/4 (where λ is an emission wavelength). Therefore, reflectance at the insulation layer 30/light-transmitting conductive layer 4 interface can be effectively reduced. Thus, light incident on the light-transmitting conductive layer 4 without being reflected by the p-type GaP contact layer 11/insulation layer 30 interface can reach the metal layer 3 and can be efficiently reflected by the metal layer 3. As a result, light extraction efficiency can be improved.

That is, light can be efficiently reflected in two stages and light extraction efficiency can be improved by combining: (1) a structure in which the critical angle is narrowed at the p-type GaP contact layer 11/insulation layer 30 interface and the totally reflected light at the interface is increased, and (2) a structure in which the reflectance is reduced at the insulation layer 30/light-transmitting conductive layer 4 interface and light is efficiently reflected by the metal layer 3. In addition, the structure is simple because it is only necessary to properly design: (1) refractive indexes n1 to n3 of the p-type GaP contact layer 11, the insulation layer 30 and the light-transmitting conductive layer 4, and (2) total thickness T comprising optical film thicknesses of the insulation layer 30 and the light-transmitting conductive layer 4.

Figure 4A:
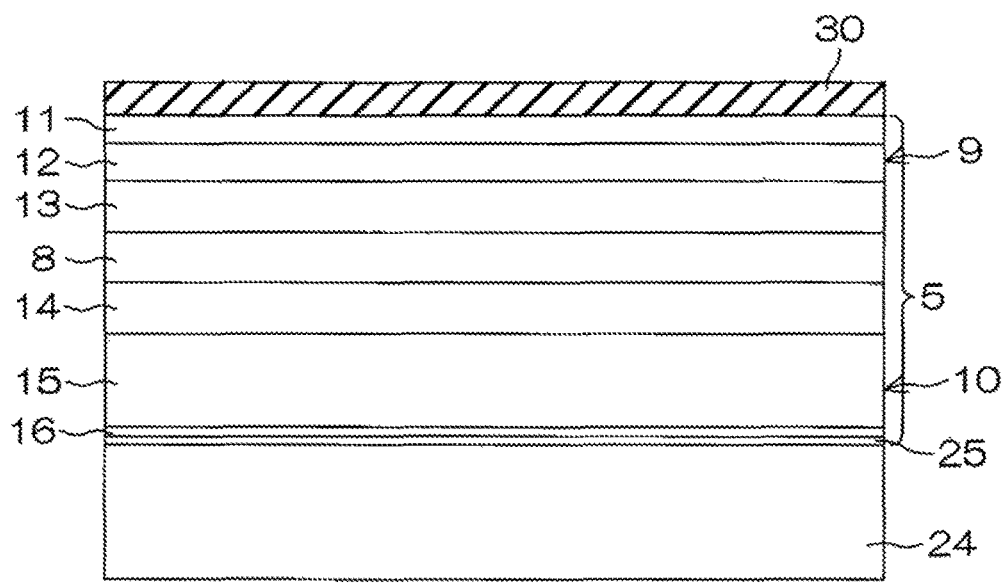
FIG. 4A is a diagram showing a part of the manufacturing process of the semiconductor light emitting device of FIG. 2.

FIGS. 4A to 4M are diagrams showing the steps of manufacturing the semiconductor light emitting device 1 of FIG. 2 in order of process. To manufacture the semiconductor light emitting device 1, for example, as shown in FIG. 4A, a III-V semiconductor structure 5 and an insulation layer 30 are formed by epitaxial growth on a growth substrate 24 made of GaAs or the like. As a growth method of the III-V semiconductor structure 5, for example, a known growth method such as a molecular beam epitaxial growth method, a metal organic vapor phase growth method, or the like can be applied. At this stage, the III-V semiconductor structure 5 includes an n-type AlInGaP etching stop layer 25, an n-type GaAs contact layer 16, an n-type AlInGaP window layer 15, an n-type AlInP clad layer 14, a light emitting layer 8, a p-type AlInP clad Layer 13, a p-type GaP window layer 12, and a p-type GaP contact layer 11 on a side of the growth substrate 24.

Figure 4B:
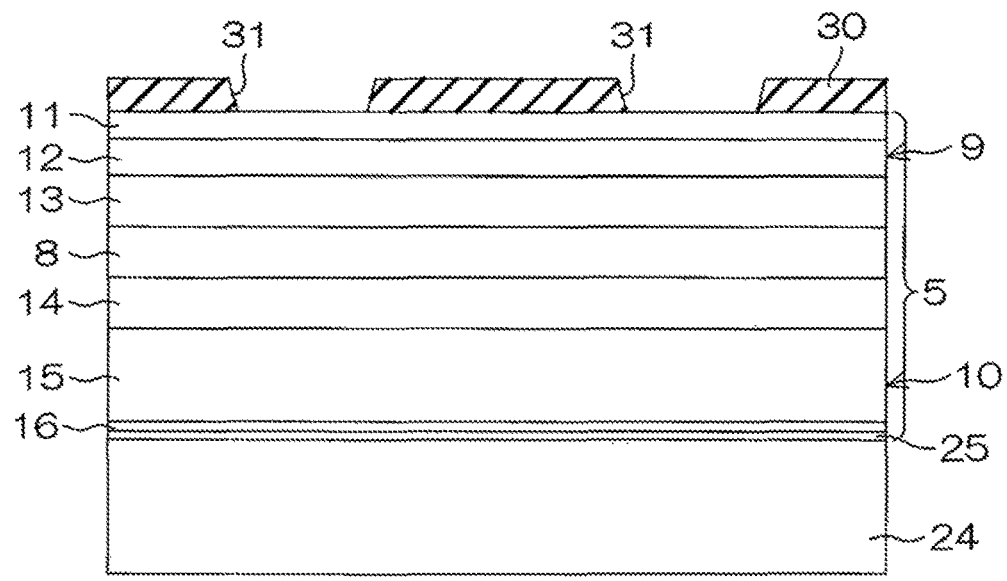
FIG. 4B is a diagram showing a next step of FIG. 4A.
Figure 4C:
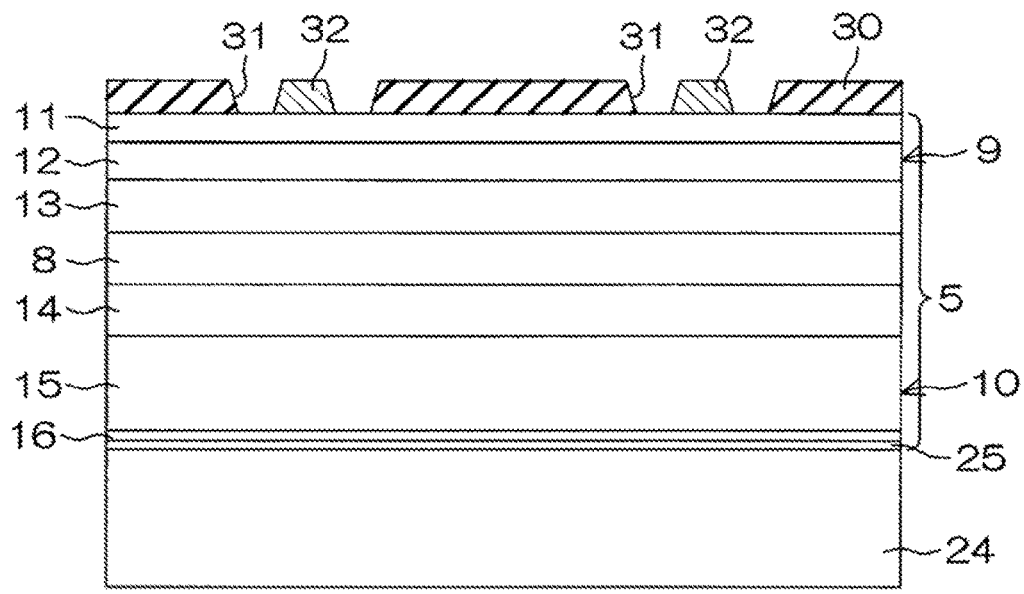
FIG. 4C is a diagram showing a next step of FIG. 4B.

Next, as shown in FIG. 4B, a contact hole 31 is formed by selectively etching the insulation layer 30. Next, as shown in FIG. 4C, a metal material is deposited on the insulation layer 30 by, for example, a vapor deposition method, and the metal material is patterned to form a p-side contact metal 32 in the contact hole 31.

Figure 4D:
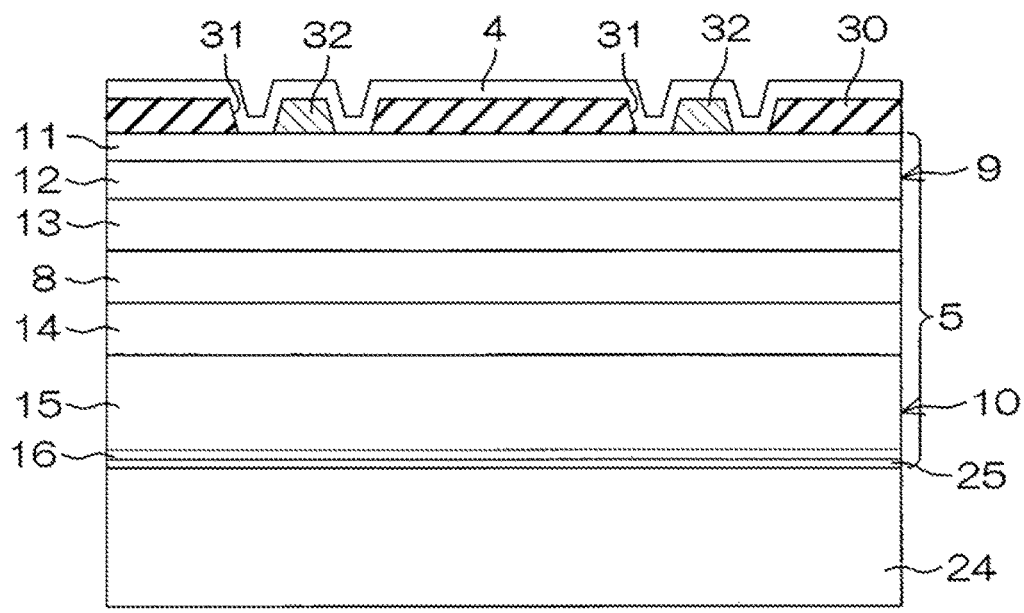
FIG. 4D is a diagram showing a next step of FIG. 4C.
Figure 4E:
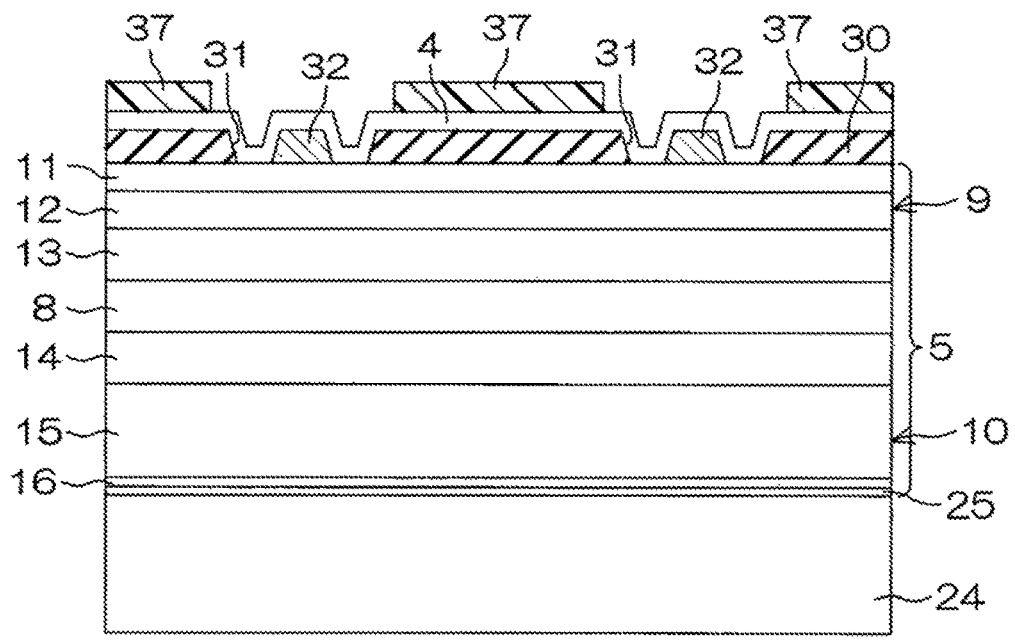
FIG. 4E is a diagram showing a next step of FIG. 4D.
Figure 4F:
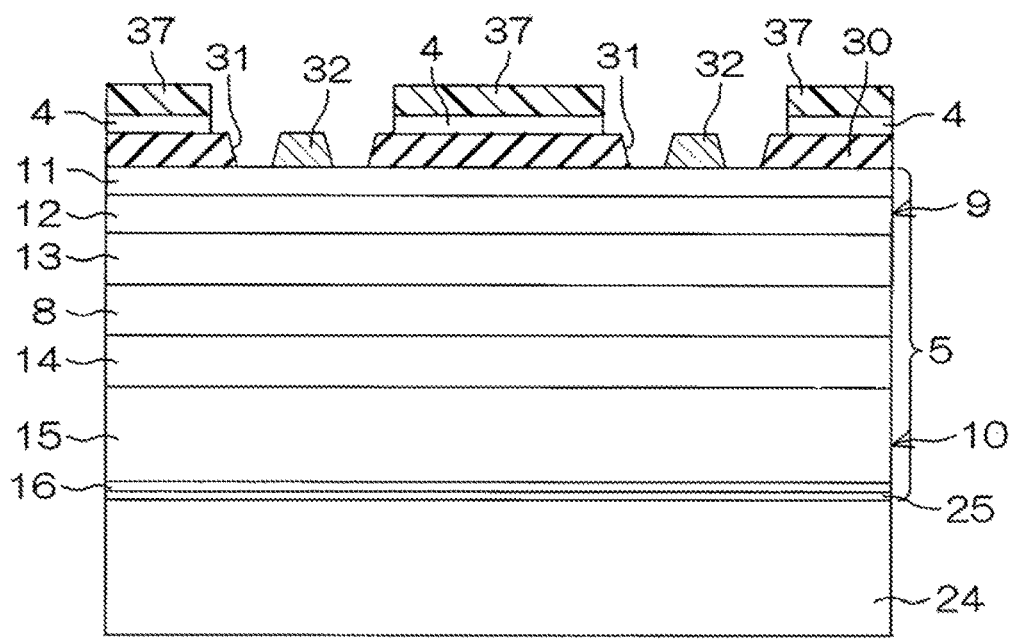
FIG. 4F is a diagram showing a next step of FIG. 4E.

Next, as shown in FIG. 4D, a light-transmitting conductive layer 4 is formed on the insulation layer 30 by, for example, a vapor deposition method. The light-transmitting conductive layer 4 enters the contact hole 31 and covers the p-side contact metal 32. Next, as shown in FIG. 4E, a mask 37 selectively covering the light-transmitting conductive layer 4 is formed. As shown in FIG. 4F, unnecessary portions of the light-transmitting conductive layer 4 are removed through the mask 37. As a result, an edge 4b of the light-transmitting conductive layer 4 is formed at a position recessed toward a region on a back surface 30a of the insulation layer 30 more than a periphery of the contact hole 31 (see FIG. 3A).

Figure 4G:
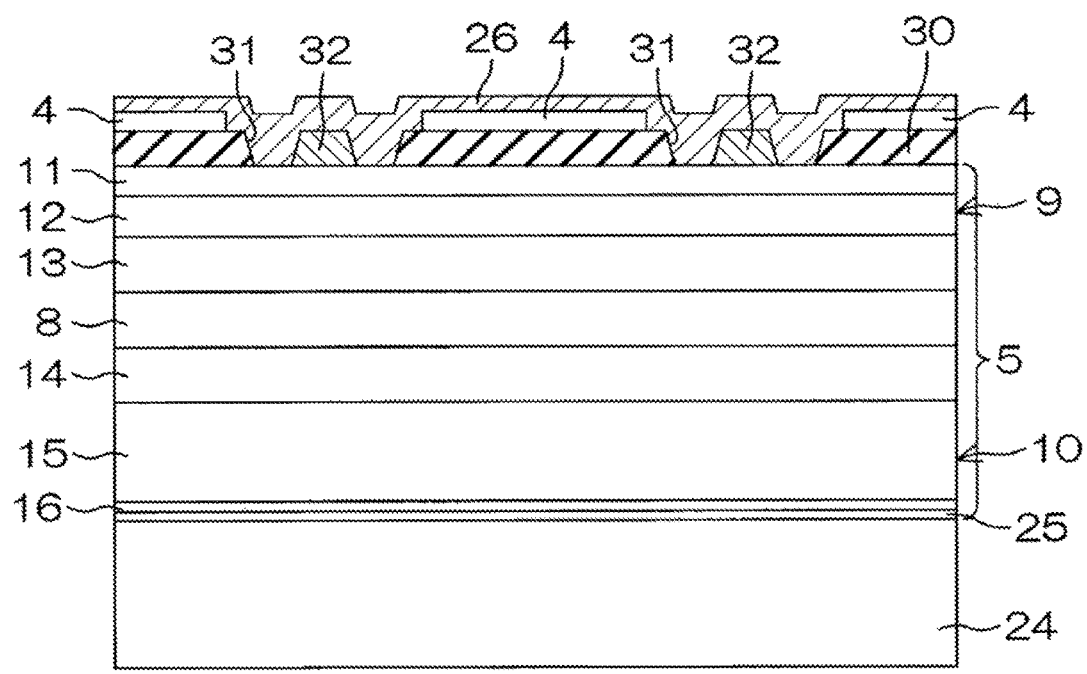
FIG. 4G is a diagram showing a next step of FIG. 4F.

Next, as shown in FIG. 4G, a first metal layer 26 is formed on the light-transmitting conductive layer 4 by, for example, a vapor deposition method. The first metal layer 26 is made of an alloy containing Au or Au, and includes at least an uppermost surface made of an Au layer. Next, a bonding step is performed on the growth substrate 24 and a substrate 2. In the bonding step, the first metal layer 26 on the growth substrate 24 and a second metal layer 27 on the substrate 2 are bonded. The second metal layer 27 is made of an alloy containing Au or Au, and includes at least an uppermost surface made of Au. The second metal layer 27 is formed on a surface of the substrate 2 (a surface opposite to a surface on which a p-side electrode 6 is formed) by, for example, a vapor deposition method before bonding.

Figure 4H:
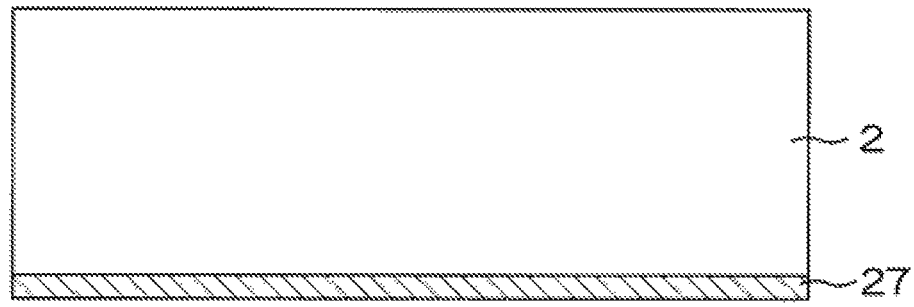
FIG. 4H is a diagram showing a next step of FIG. 4G.
Figure 4H:
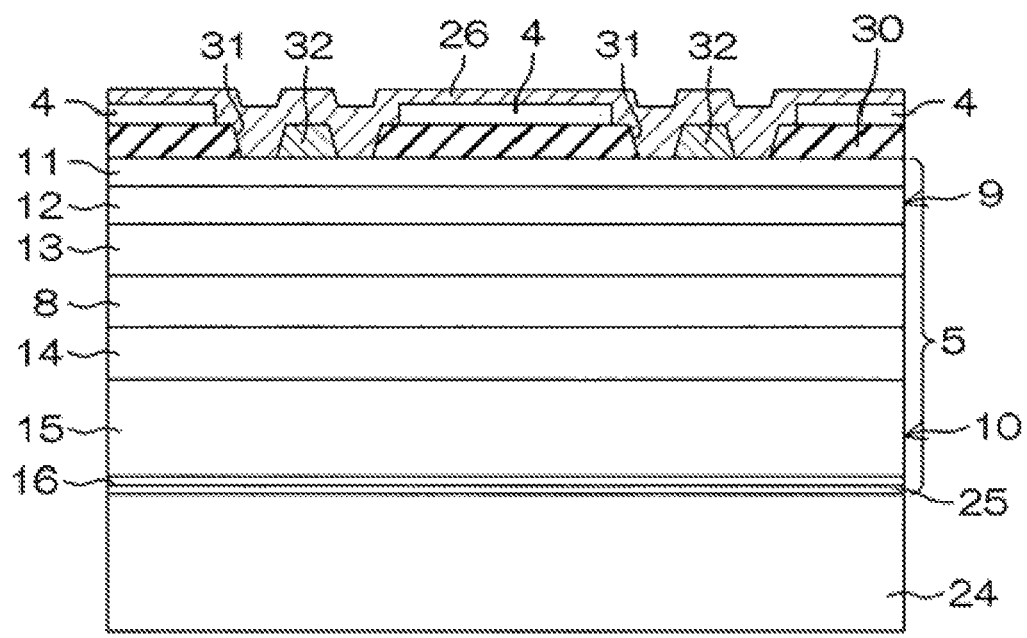

More specifically, as shown in FIG. 4H, the growth substrate 24 and the substrate 2 are overlapped, with the first metal layer 26 and the second metal layer 27 facing each other, and the first metal layer 26 and the second metal layer 27 are bonded to each other. Bonding of the first metal layer 26 and the second metal layer 27 may be performed by, for example, thermocompression. Thermocompression conditions can include, for example, a temperature of between 250° C. and 700° C. (preferably between about 300° C. and 400° C.) and a pressure of between 10 MPa and 20 MPa. By this bonding, as shown in FIG. 4I, the first metal layer 26 and the second metal layer 27 are combined to form the metal layer 3.

Figure 4I:
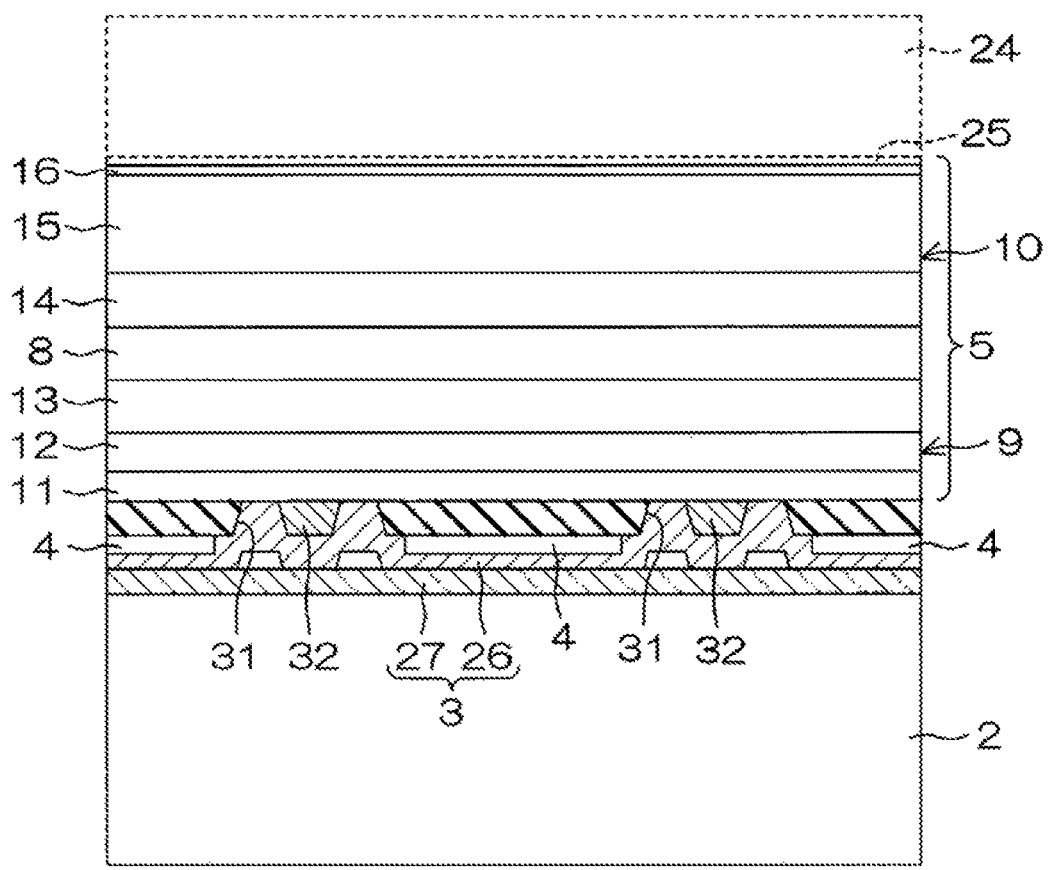
FIG. 4I is a diagram showing a next step of FIG. 4H.

Next, as shown in FIG. 4I, the growth substrate 24 is removed by, for example, wet etching. Since the n-type AlInGaP etching stop layer 25 is formed on the uppermost surface of the III-V semiconductor structure 5, the n-type GaAs contact layer 16 and the n-type AlInGaP window layer, 15 which contribute to the characteristics of the semiconductor light emitting device 1, are not affected during the wet etching. Thereafter, the n-type AlInGaP etching stop layer 25 is also removed.

Figure 4J:
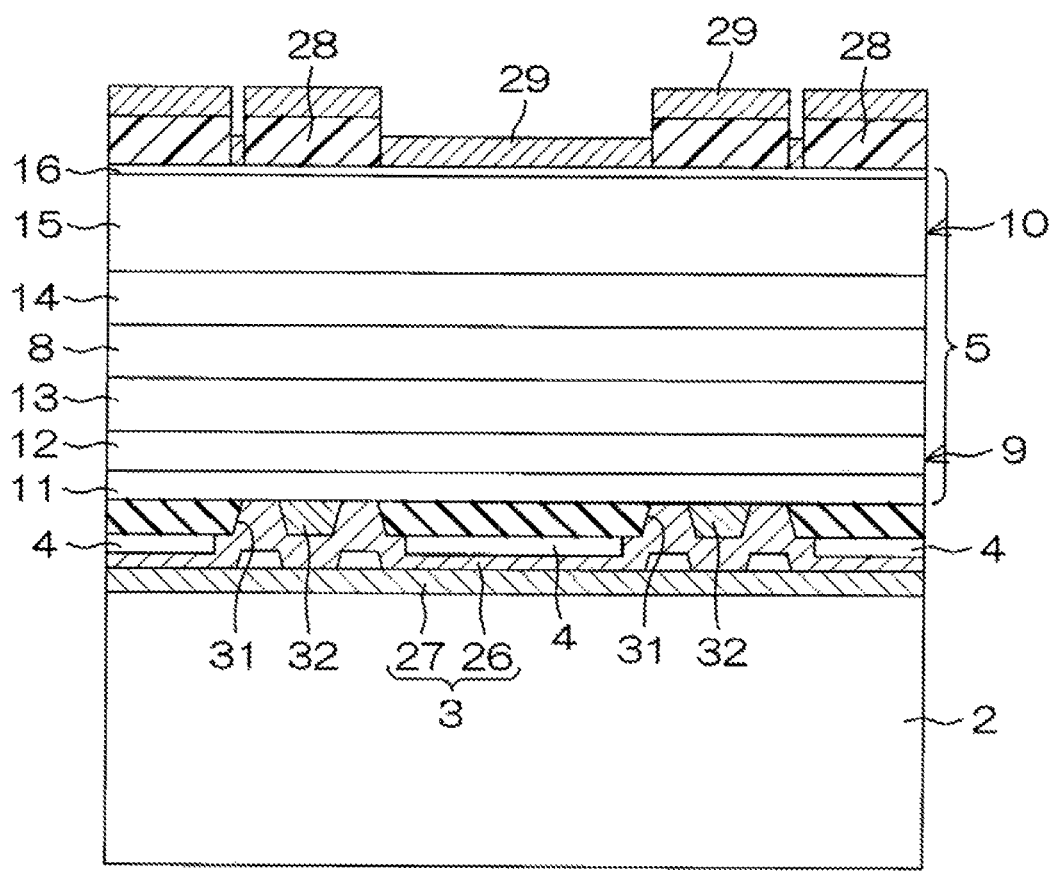
FIG. 4J is a diagram showing a next step of FIG. 4I.

In the next step, an n-side electrode 7 is formed. In this embodiment, an n-side electrode 7 is formed by a lift-off method. Specifically, as shown in FIG. 4J, first, a resist 28 having an opening of the same pattern as an electrode pattern of the n-side electrode 7 is formed on the n-type GaAs contact layer 16. Next, an electrode material film 29 is laminated on the III-V semiconductor structure 5 by, for example, a vapor deposition method.

Figure 4K:
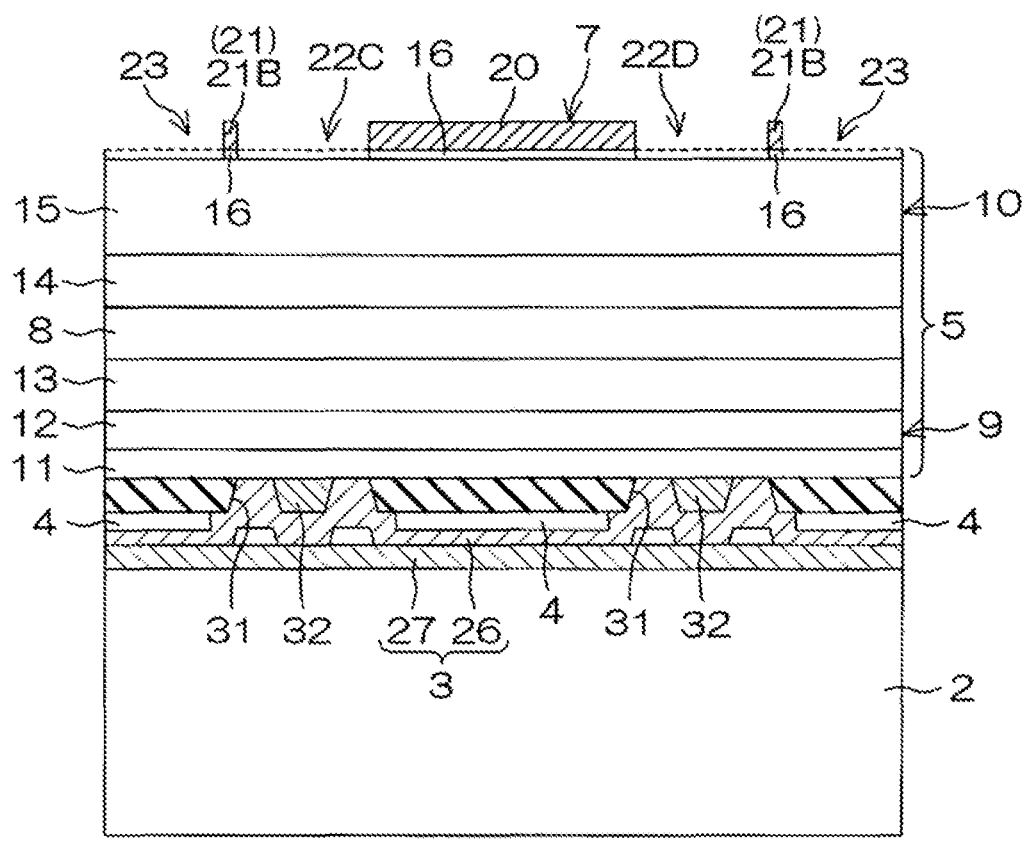
FIG. 4K is a diagram showing a next step of FIG. 4J.

Next, as shown in FIG. 4K, the electrode material film 29 on the resist 28 is removed together with the resist 28. As a result, an n-side electrode 7 made of remaining electrode material film 29 on the n-type GaAs contact layer 16 is formed. Thereafter, the n-type GaAs contact layer 16 exposed from the n-side electrode 7 is removed by etching. As a result, the n-type AlInGaP window layer 15 is exposed in a portion other than the n-side electrode 7.

Figure 4L:
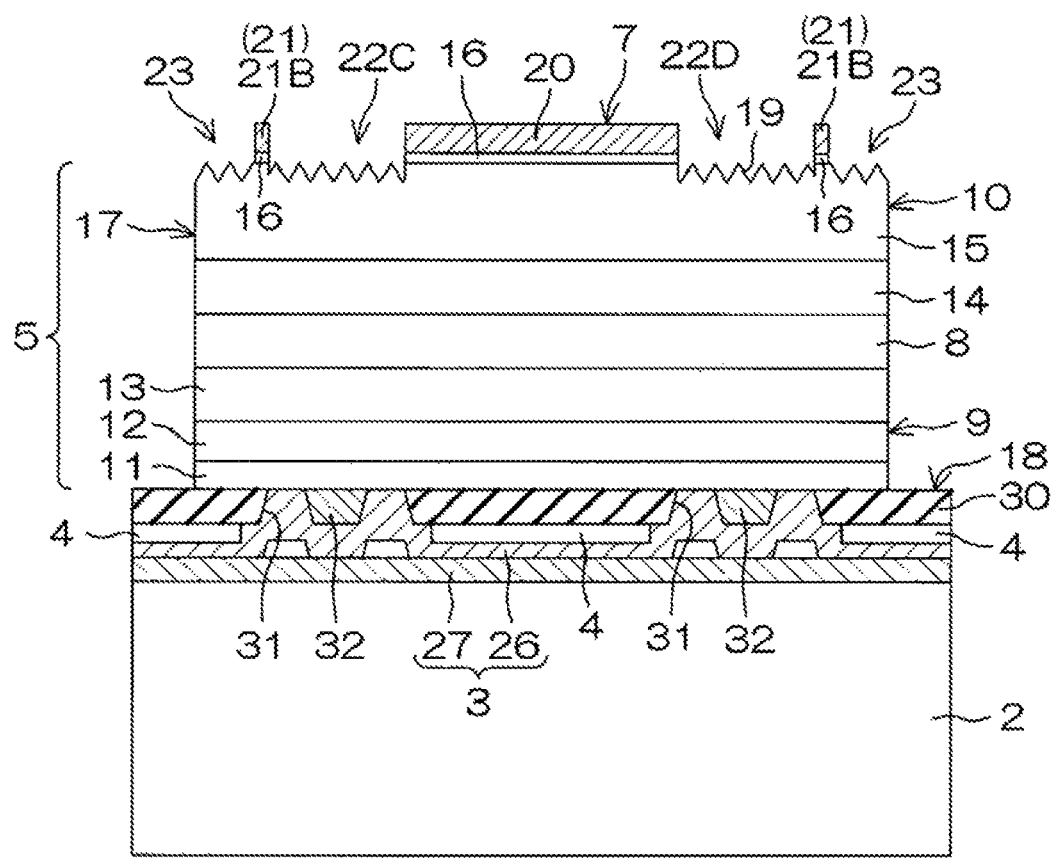
FIG. 4L is a diagram showing a next step of FIG. 4K.

Next, as shown in FIG. 4L, a fine uneven shape 19 is formed on a surface of the n-type AlInGaP window layer 15 by, for example, a frost process (wet etching) or the like. The frost process can be performed by dry etching. Next, by selectively removing periphery portions of the III-V semiconductor structure 5, a mesa part 17 and a drawer part 18 are formed. The mesa part 17 and the drawer part 18 can be formed by, for example, wet etching.

Figure 4M:
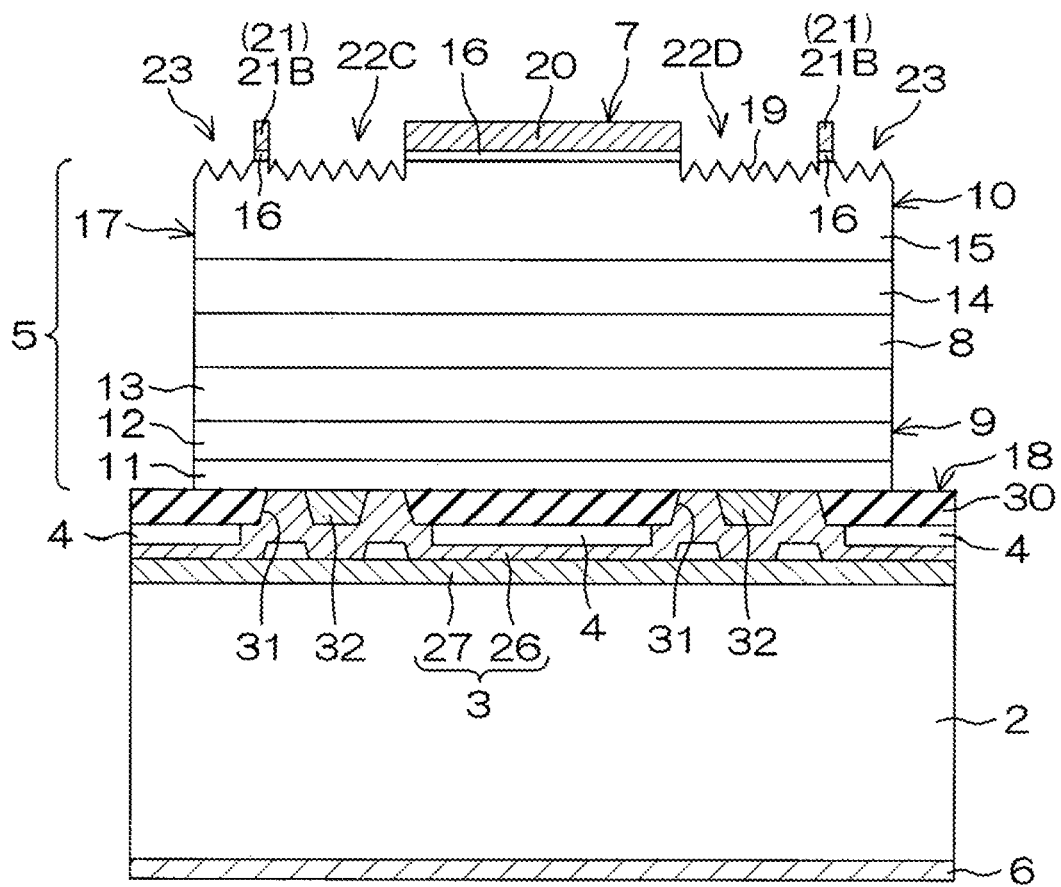
FIG. 4M is a diagram showing a next step of FIG. 4L.

Next, as shown in FIG. 4M, a p-side electrode 6 is formed on a back surface of the substrate 2 by, for example, a vapor deposition method. Through the above steps, a semiconductor light emitting device 1 is obtained.

Although an embodiment of the present invention has been described above, the present invention can be implemented in other forms. For example, in the above embodiment, it is assumed that the layer (of the p-type semiconductor layer 9) in contact with the insulation layer 30 is the p-type GaP contact layer 11, the insulation layer 30 is SiO2 film, and the light-transmitting conductive layer 4 is ITO. But these materials can be appropriately changed from materials satisfying the relation n1>n2<n3. For example, when there is a p-type layer in contact with the insulation layer 30 in addition to the p-type GaP contact layer 11, a refractive index of the p-type layer may be adopted as the refractive index n1 of the present invention.

In addition, it is possible to make various design changes within the scope of the claims.

Embodiment

Next, the present invention will be explained based on embodiments, but the present invention is not limited by the following embodiments. The inventors of the present invention investigated how much the reflectance at the insulation layer 30/light-transmitting conductive layer 4 interface can be reduced by setting the total thickness T comprising the sum of optical film thicknesses to 1.25λ (where λ is an emission wavelength) as shown in Table 1. For comparison, as a reference example, the reflectance when the total thickness T comprising the sum of optical film thicknesses is 1λ was also measured. The results are shown in FIG. 5.

Figure 5:
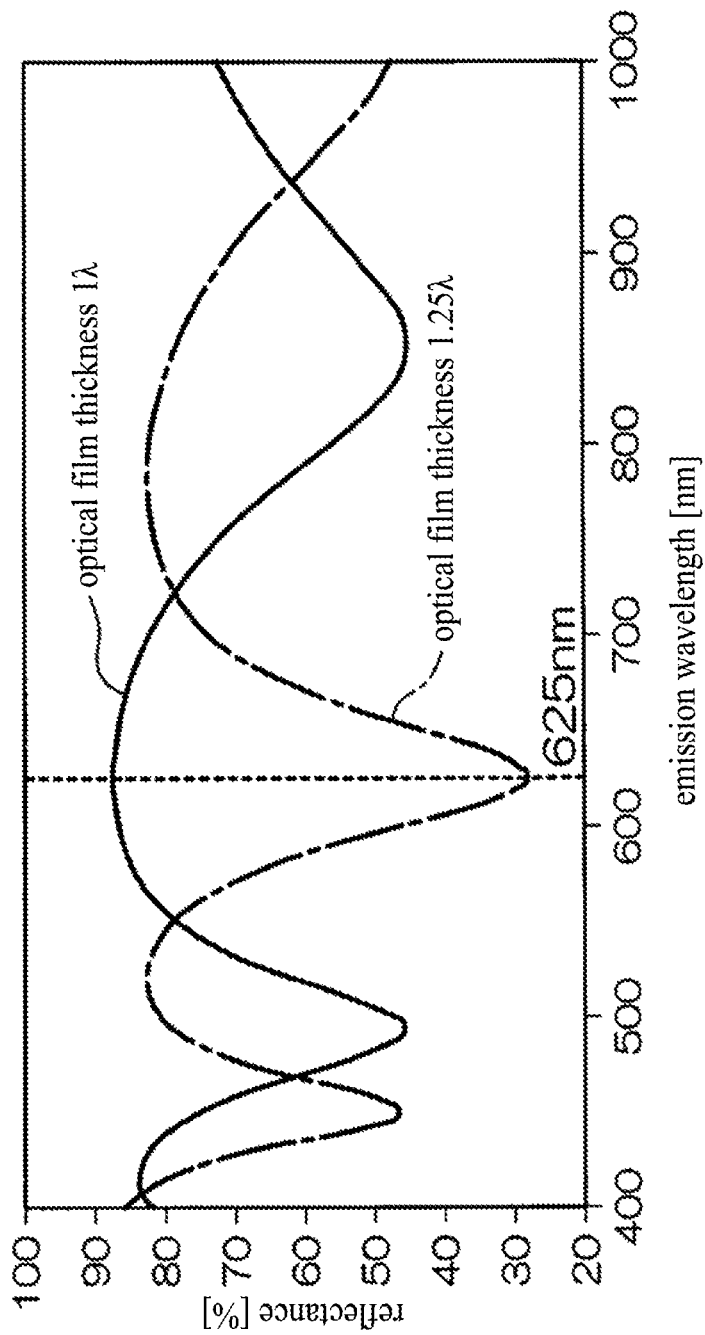
FIG. 5 is a diagram showing a relationship between an emission wavelength of a semiconductor light emitting device according to a reference example and the reflectance at an ITO/SiO$_2$ interface.

As shown in FIG. 5, in the reference example (T=1λ), the reflectance was about 80% in the range of about 560 nm to 660 nm, whereas in the embodiment (T=1.25λ) the reflectance could be reduced to less than about 50% in the same range.

What is claimed is:

1. A semiconductor light emitting device, comprising:
   a substrate;
   a metal layer on the substrate;
   a light-transmitting conductive layer on the metal layer;
   an insulation layer on the light-transmitting conductive layer; and
   a semiconductor layer above the insulation layer, comprising:
      a light emitting layer;
      a first conductive type layer disposed on the substrate side with respect to the light emitting layer; and
      a second conductive type layer disposed on the opposite side of the substrate with respect to the light emitting layer;
   wherein the first conductive type layer has a refractive index n1, and the light-transmitting conductive layer has a refractive index n3, the insulation layer has a refractive index n2 satisfying n1>n2<n3, and the insulation layer has a contact hole for selectively exposing the first conductive type layer, a contact metal electrically connected to the first conductive type layer is disposed in the contact hole, and an edge of the light-transmitting conductive layer is arranged to be recessed toward a region on the insulation layer more than a periphery of the contact hole.

2. The semiconductor light emitting device of claim 1, wherein a total thickness T of optical film thicknesses of the light-transmitting conductive layer and the insulation layer is an odd multiple of $\lambda/4$ (where $\lambda$ is an emission wavelength).

3. The semiconductor light emitting device of claim 1, wherein a critical angle of total reflection at an interface between the first conductive type layer and the insulation layer is 30° or less.

4. The semiconductor light emitting device of claim 1, wherein a difference between the refractive index n1 and the refractive index n2 is 1.7 or more.

5. The semiconductor light emitting device of claim 1, wherein the refractive index n1 is 3.0 to 3.5, the refractive index n2 is 1.3 to 1.6, and the refractive index n3 is 1.7 to 2.0.

6. The semiconductor light emitting device of claim 1, wherein the first conductive type layer comprises p-type GaP, the insulation layer comprises SiO2, and the light-transmitting conductive layer comprises ITO (indium tin oxide).

7. The semiconductor light emitting device of claim 1, wherein the emission wavelength $\lambda$ is between 560 nm and 660 nm and a total thickness T of optical film thicknesses is 1.25$\lambda$.

8. The semiconductor light emitting device of claim 1, further comprising a space formed between the periphery of the contact hole and an edge of the contact metal, wherein the space is filled with the metal layer.

9. The semiconductor light emitting device of claim 1, wherein the metal layer comprises Au.

10. The semiconductor light emitting device of claim 1, wherein the substrate comprises a silicon substrate.

11. The semiconductor light emitting device of claim 1, further comprising a surface electrode on the semiconductor layer.

12. The semiconductor light emitting device of claim 1, further comprising a back electrode on a backside of the substrate.

13. The semiconductor light emitting device of claim 1, wherein the semiconductor has a surface formed to be a fine uneven shape.

14. A semiconductor light emitting device, comprising:
    a substrate having a first side and a second side opposite to the first side;
    a metal layer on the first side of the substrate;
    a light-transmitting conductive layer on the metal layer;
    an insulation layer on the light-transmitting conductive layer; and
    a semiconductor layer on the insulation layer,
    wherein the insulation layer has a contact hole for selectively exposing the semiconductor layer, a contact metal electrically connected to the semiconductor layer is disposed in the contact hole, and an edge of the light-transmitting conductive layer is arranged to be overlapping the insulation layer when viewed in a first direction perpendicular to the first side of the substrate.

15. The semiconductor light emitting device of claim 14, wherein the semiconductor layer comprises a first conductive type layer disposed on the first side and a second conductive type layer disposed on the second side.

16. The semiconductor light emitting device of claim 15, wherein the first conductive type layer has a refractive index n1, the insulation layer has a refractive index n2, the light-transmitting conductive layer has a refractive index n3, and n1>n2<n3.

17. The semiconductor light emitting device of claim 15, wherein the contact hole selectively exposes the first conductive type layer.

18. The semiconductor light emitting device of claim 14, wherein a total thickness T of optical film thicknesses of the light-transmitting conductive layer and the insulation layer is an odd multiple of $\lambda/4$ (where $\lambda$ is an emission wavelength).

19. The semiconductor light emitting device of claim 15, wherein a critical angle of total reflection at an interface between the first conductive type layer and the insulation layer is 30° or less.

20. The semiconductor light emitting device of claim 14, further comprising a space formed between a periphery of the contact hole and an edge of the contact metal, wherein the space is filled with the metal layer.

* * * * *